·

US010392690B1

(12) United States Patent
Alsayegh et al.

(10) Patent No.: US 10,392,690 B1
(45) Date of Patent: Aug. 27, 2019

(54) METHOD FOR SYNTHESIZING A THIN FILM STAINLESS STEEL COATING

(71) Applicant: KUWAIT INSTITUTE FOR SCIENTIFIC RESEARCH, Safat (KW)

(72) Inventors: Naser M.A.E.H.M.A. Alsayegh, Al-Qirawan (KW); Maryam Adnan Saeed, Al-Jabriya (KW); Feras Ghazi Alzubi, Safat (KW)

(73) Assignee: Kuwait Institute for Scientific Research, Safat (KW)

( * ) Notice: Subject to any disclaimer, the term of this patent is extended or adjusted under 35 U.S.C. 154(b) by 0 days.

(21) Appl. No.: 16/274,383

(22) Filed: Feb. 13, 2019

(51) Int. Cl.
  *C23C 14/16* (2006.01)
  *C23C 14/30* (2006.01)
  *C23C 14/18* (2006.01)

(52) U.S. Cl.
  CPC .............. *C23C 14/16* (2013.01); *C23C 14/18* (2013.01); *C23C 14/30* (2013.01)

(58) Field of Classification Search
  None
  See application file for complete search history.

(56) References Cited

U.S. PATENT DOCUMENTS

| 4,006,268 | A | * | 2/1977 | Kennedy | ................ | C23C 14/24 |
| | | | | | | 204/192.11 |
| 7,244,034 | B1 | | 7/2007 | Karandikar et al. | | |
| 2003/0180571 | A1 | | 9/2003 | Singh | | |
| 2010/0189978 | A1 | | 7/2010 | Schier | | |

FOREIGN PATENT DOCUMENTS

CN    105483623 A    4/2016

OTHER PUBLICATIONS

Electron beam freeforming of stainless steel using solid wire feed. Materials and Design 28 (2007) 2278-2286 (Year: 2007).*
Dave et al., "Electron Beam Solid Freeform Fabrication of Metal Parts," Annual International Solid Freeform Fabrication Symposium, 1995, pp. 64-71.
Wanjara et al., "Electron Beam Freeforming of Stainless Steel Using Solid Wire Feed," Materials and Design, vol. 28, Issue 8, 2007, pp. 2278-2286.

* cited by examiner

*Primary Examiner* — David P Turocy
(74) *Attorney, Agent, or Firm* — Richard C. Litman

(57) ABSTRACT

A method for synthesizing thin film stainless steel coating can include using an e-beam PVD technique for depositing elements of stainless steel, i.e., Fe, Cr, Ni, Mo, and Mn, on a target surface, e.g., a surface of metallic origin. The method can include thermal evaporation of a source stainless steel material at a given percentage of electron beam power and a given vacuum pressure to provide a stainless steel coating layer on the target surface. The stainless steel coating layer can have a uniform thickness of about 150 nm, for example. The method can provide uniform stainless steel elemental distribution on the target surface. The stainless steel of the coating layer on the target surface can be of a grade that is different from the source stainless steel.

3 Claims, 4 Drawing Sheets

METHOD FOR SYNTHESIZING A THIN FILM STAINLESS STEEL COATING

BACKGROUND

1. Field

The disclosure of the present patent application relates to bulk material surface coating, and particularly to a method for coating a surface with a thin film stainless steel coating.

2. Description of the Related Art

Stainless steels are passive metallic alloys that are well-known for their corrosion resistance, high sheer strength, high and low temperature resistance, recyclability, and long life cycle. The properties of these alloys can be strongly linked to their microstructure, which can be ferritic, austenitic, or a combination of both of these phases. For these reasons, stainless steel can be useful for fabricating various types of equipment and transportation structures, e.g., pipelines, heat exchangers, and medical equipment. It is also possible to achieve the desired thermo-physical properties and mechanical performance of stainless steel structures for structures constructed from other metal materials or ceramic materials by providing a stainless steel coating or external film to cover the outer surface of the non-stainless steel materials.

Techniques typically used for stainless steel coating include electron beam solid freeform and cold gas dynamic spraying. The electron beam solid freeform technique includes melting stainless steel feedstock, in the shape of a wire, on a desired surface. This technique only provides coatings having large film thicknesses (>0.33 mm) and geometrical constraints. Such coatings also require a mechanical surface finish, cover a relatively small coating area, and have multi-layer crossovers. Cold gas dynamic spraying of pre-prepared stainless steel powders can be used to achieve dense films of as low as 20 μm thickness with high deposition rates (100-1,000 particle mass per minute). The problems associated with this process, however, include traces of contamination within the fabricated film, a large number of accompanying parameters that needs to be adjusted (e.g. nozzle diameter, distance between the nozzle and the targeted surface, particles size, and particles impact speed), non-uniform particle distribution (i.e. higher particle concentration at the center of the flow), particles and/or surface plastic deformation caused from the on surface jet impingement of particles, increase in coated material surface roughness, relatively small deposition covered area, and larger build-up at layer crossovers.

Thus, a method for synthesizing thin film stainless steel coating solving the aforementioned problems is desired.

SUMMARY

A method for synthesizing thin film stainless steel coating can include using e-beam PVD coating to provide a thin film of stainless steel on a target surface of metallic or ceramic origin. The e-beam PVD coating takes place inside a vacuum chamber where the target surface is disposed on a sample holder placed vertically above a stainless steel evaporation source. An electron beam is used to melt the evaporation source to generate a vapor flow of the material. The vapor flow is then condensed on the target surface to form the coating layer on the target surface. The stainless steel coating layer on the target surface can be of a grade that is different from the source stainless steel.

These and other features of the present teachings will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
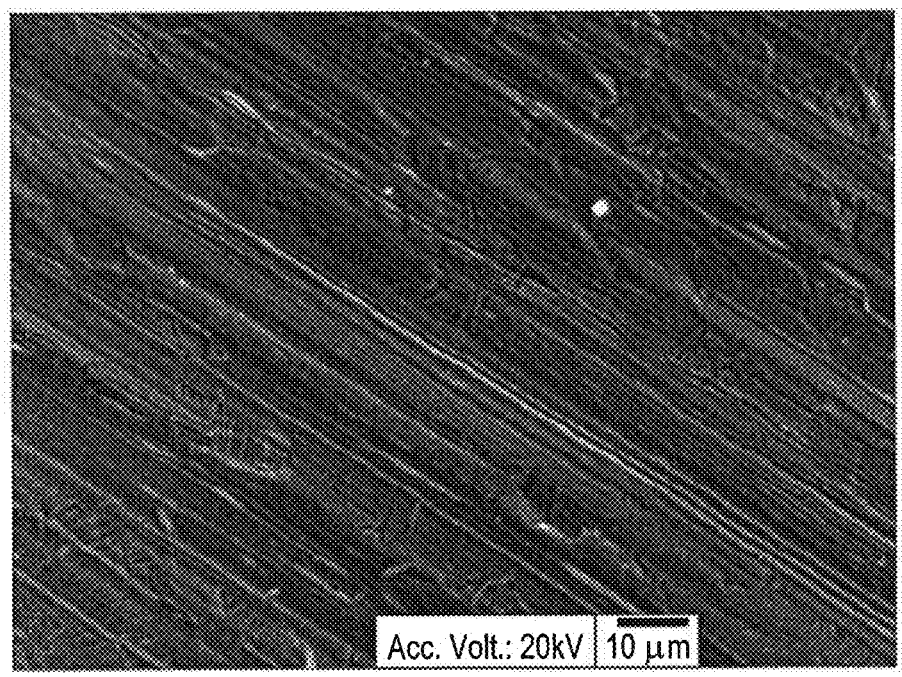
FIG. 1A is an SEM image (1000 magnification) of a stainless steel film deposited on a copper substrate at a power of 3% according to the present method.

A method for synthesizing a thin film stainless steel coating can include using electron-beam physical vapor deposition (herein, "e-beam PVD") for depositing elements of stainless steel, i.e., Fe, Cr, Ni, Mo, and Mn, on a target surface, e.g., a metallic or ceramic surface to provide a thin film coating layer. The method can include thermal evaporation of a source stainless steel material (evaporation source) at a given percentage of electron beam power and a given vacuum pressure to provide the stainless steel thin film coating on the target surface. The stainless steel thin film coating can have a uniform thickness ranging from about 1 nm to about 150 nm. The steel elemental distribution of the thin film coating on the target surface can be uniform. The stainless steel of the coating layer on the target surface can be of a grade that is different from the source stainless steel.

The method provides a stainless steel film with high purity e.g., the film can be free from contaminants.

The electron-beam physical vapor deposition of the present method includes evaporating a single evaporation source including stainless steel, at fixed electron beam power percentages and under high inner chamber vacuum conditions (e.g., a starting vacuum pressure value of $6 \times 10^{-6}$ Torr). An electron beam melts the stainless steel to generate a vapor flow of the stainless steel material and the vapor flow is condensed on a target surface to form the coating layer on the target surface. Preferably, the fixed electron beam power percentages for the stainless steel deposition process ranges from about 3% to about 10%, e.g., 3% to 4%. Different categories and phases of stainless steel films can be achieved by changing the controlled electron beam power percentage and/or the evaporation source elemental composition percentages. A desired evaporation source elemental composition percentage can be achieved by melting different percentages of Fe, Cr, Ni, Mo, and Mn together, using an arc melter, to form the new composite. The stainless steel film can have a thickness ranging from about 1 nm to about 150 nm.

The present method can achieve thin films (i.e. in the scale of nm) of stainless steel. An exemplary thin film layer can have a thickness as low as 1 nm. Unlike prior methods, the present methods do not produce high deviation at crossover layers and produce a coating with reduced bulk material surface roughness. The method can also provide high precision controlled film thickness and can coat large surface areas and surfaces with complicated surface geometries. The coatings can provide an anti-corrosive layer to oxidized materials and wear resistance to bulk material surfaces. The method can achieve films with uniform elemental distribution and surface coverage. The method can achieve stainless steel films with very high film to surface bonding. The films can be free of contamination.

The method can be used to provide a thin film stainless steel coating on any metallic or ceramic material. For example, the method can be used to provide a coating on pipes, instruments, gas turbine blades, and automotive parts.

Also unlike prior methods, the present method can provide different categories of stainless steel, from a single evaporation source, based on the electron beam constant power percentage. In addition, elemental percentages of the evaporation source can be modified as desired to achieve a desired grade of stainless steel. For example, different percentages of Fe, Ni, Mn, Mo, and Cr (which form the stainless steel alloys) can be combined using an electric arc melter to fabricate the final product (i.e. the evaporation source). The evaporation source can later be used to fabricate thin stainless steel films of different categories (e.g. 301, 304, 310, and 347) on a bulk materials surface. An exemplary film composition for obtaining stainless steel of grade 301 is: Ni: 6%, Cr: 16%, Fe: 88%.

The present teachings are illustrated by the following examples.

Example 1

AISI stainless steel 316L balls of 8.5 mm diameter were purchased from Bearing Warehouse limited. Using an EB-PVD device, various constant percentages of electron beam power were examined, namely, in the range of 3-10%, with a starting vacuum pressure value of $6 \times 10^{-6}$ Torr, and DC output voltage of 8 kV, to deposit a 150 nm coating layer on a 1 cm² copper surface. Lower percentages of power (i.e. <3%) were not selected because deposition could not be achieved at lower power percentages. Higher percentages of power (i.e. >10%) were excluded due to the restriction provided by the manufacturer of the EB-PVD device. The aim behind the variation in percentage of power was to analyze the uniformity of the deposition and the thin film elemental percentage (i.e. to obtain a uniform film with elemental percentage close to the stainless steel evaporation source). The time required for achieving the coating layers varied between 11 to 242 min.

Figure 1B:
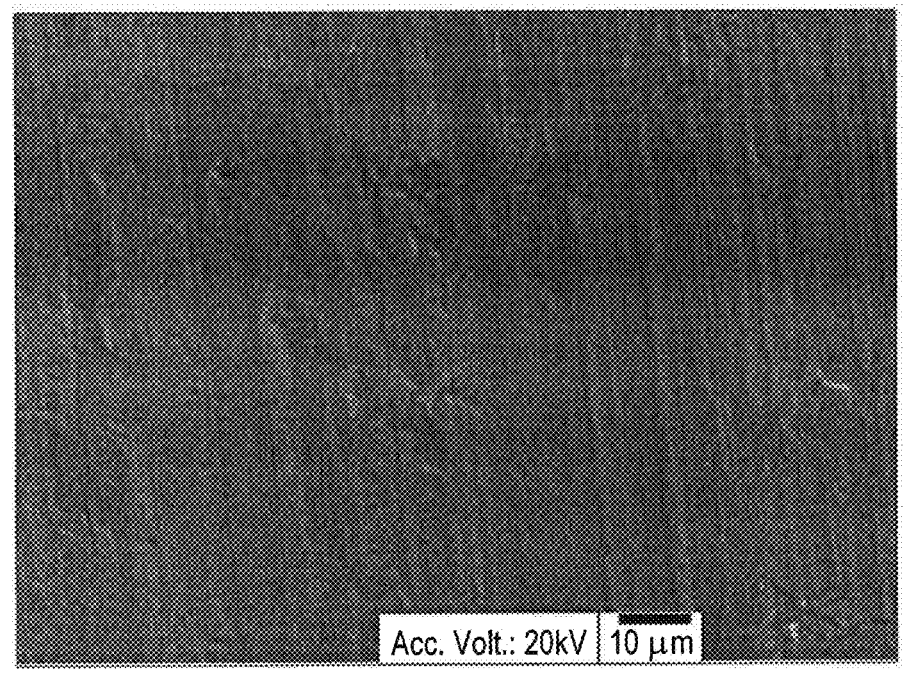
FIG. 1B is an SEM image (1000 magnification) of a stainless steel film deposited on a copper substrate at a power of 4% according to the present method.
Figure 2A:
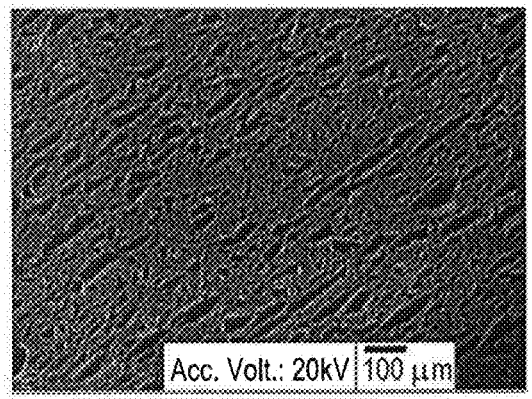
FIG. 2A is an SEM image (100 magnification) of a stainless steel film deposited on a copper substrate at a power of 6% according to the present method.
Figure 2D:
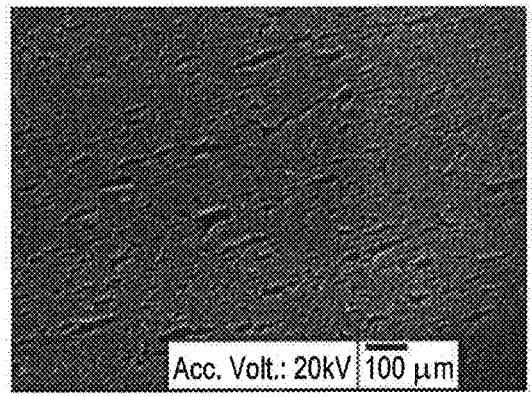
FIG. 2D is an SEM image (100 magnification) of a stainless steel film deposited on a copper substrate at a power of 8% according to the present method.
Figure 2B:
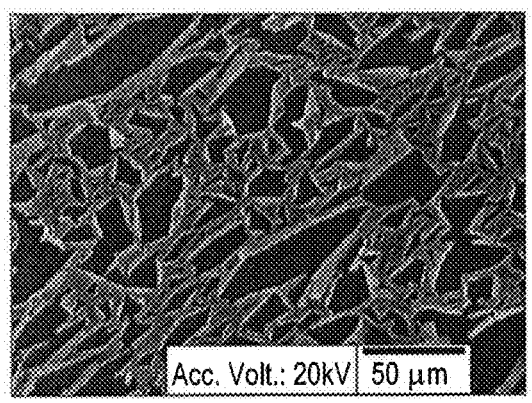
FIG. 2B is an SEM image (500 magnification) of a stainless steel film deposited on a copper substrate at a power of 6% according to the present method.
Figure 2E:
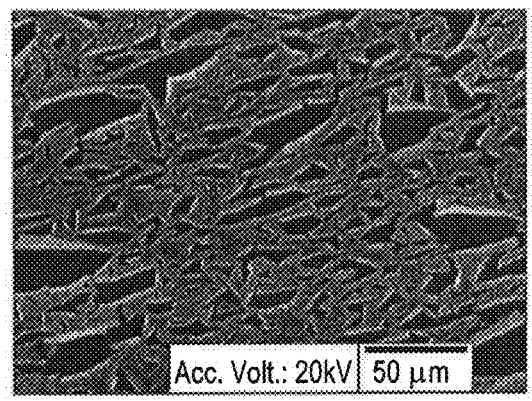
FIG. 2E is an SEM image (500 magnification) of a stainless steel film deposited on a copper substrate at a power of 8% according to the present method.
Figure 2C:
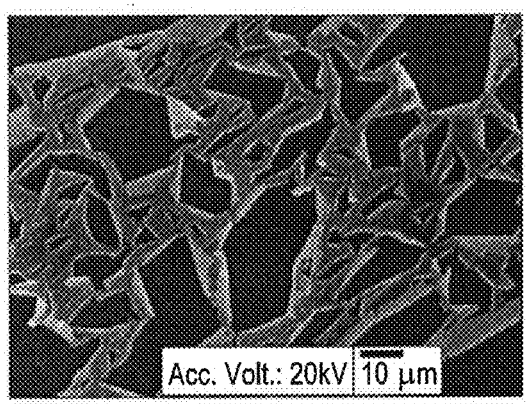
FIG. 2C is an SEM image (1000 magnification) of a stainless steel film deposited on a copper substrate at a power of 6% according to the present method.
Figure 2F:
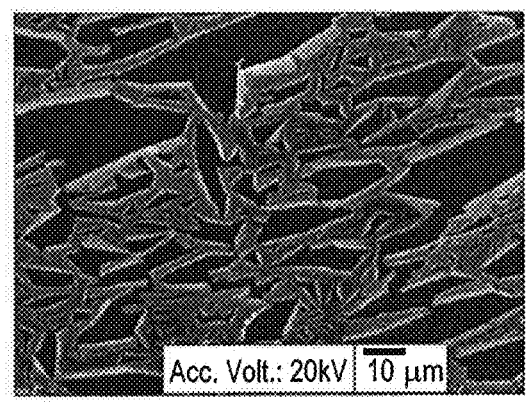
FIG. 2F is an SEM image (1000 magnification) of a stainless steel film deposited on a copper substrate at a power of 8% according to the present method.
Figure 2G:
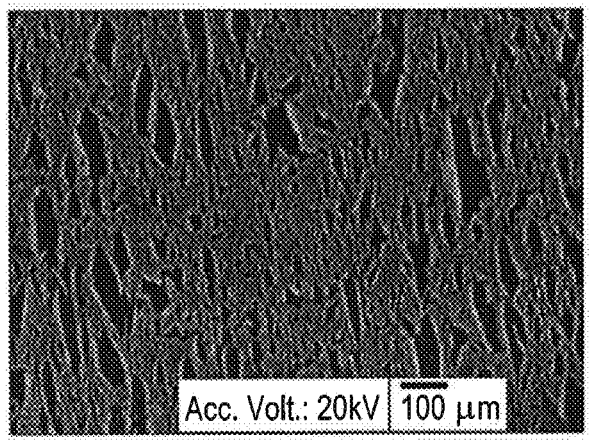
FIG. 2G is an SEM image (100 magnification) of a stainless steel film deposited on a copper substrate at a power of 10% according to the present method.
Figure 2H:
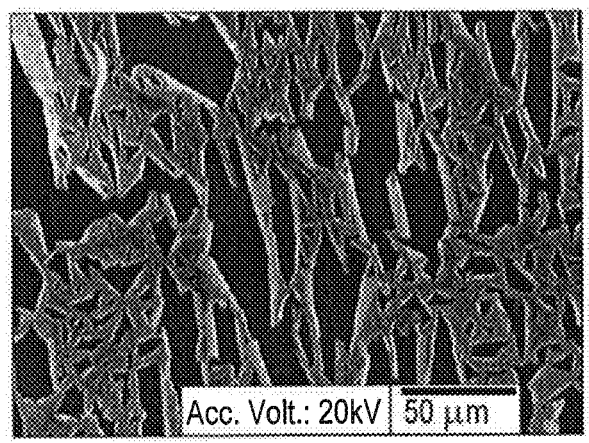
FIG. 2H is an SEM image (500 magnification) of a stainless steel film deposited on a copper substrate at a power of 10% according to the present method.
Figure 2I:
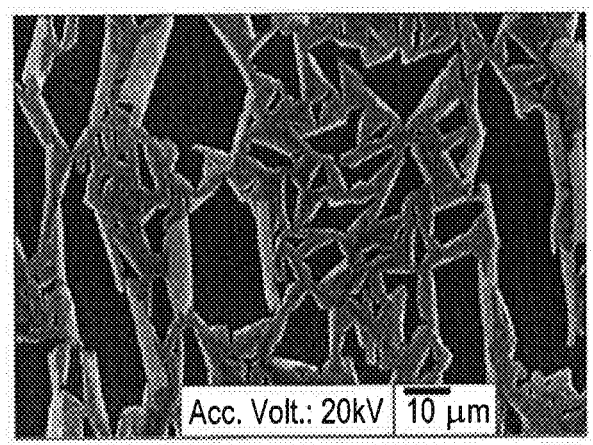
FIG. 2I is an SEM image (1000 magnification) of a stainless steel film deposited on a copper substrate at a power of 10% according to the present method.

A JSM-6010LA analytical scanning electron microscope (ASEM) device, manufactured by JEOL, was then used to determine the surface topography of the coating layer, for each coated sample. It was found that a power of 3% and a power of 4% provided a uniform film on the copper surface (FIGS. 1A and 1B, respectively). It was also discovered that, increasing the power above 4% results in the film layer semi-detaching from the surface, as seen in FIGS. 2A-2I. As a result, part of the surface was uncoated and the coated portions were not uniformly coated due to the layer being semi-detached.

Example 2

Figure 3:
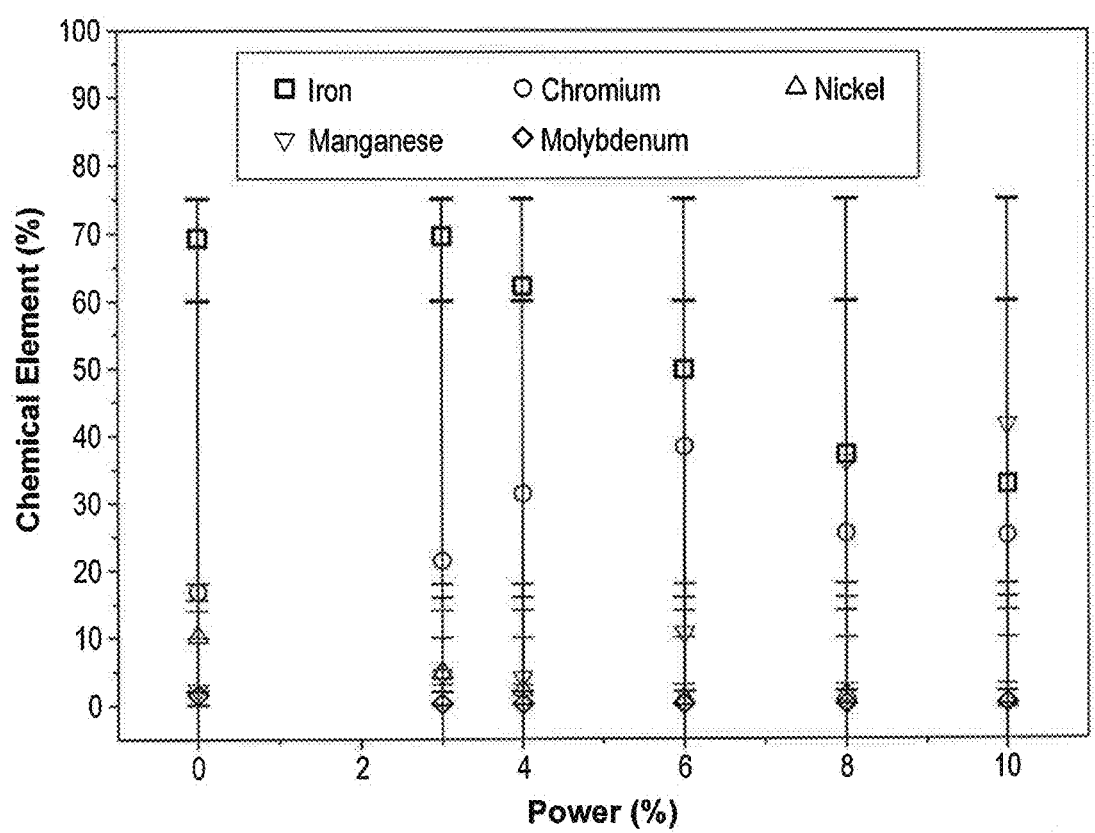
FIG. 3 is a graph showing X-ray fluorescence elemental analysis of the stainless steel source (power=zero), and EDS elemental analysis of the stainless steel film deposited with 3, 4, 6, 8, and 10 constant electron beam power percentages.

An energy dispersive X-ray spectroscopy (EDS) instrument, which was attached within the ASEM device, was used to illustrate the film elemental percentage and particles elemental distribution of the coating samples produced using different power percentages as described above. It is important to note that copper, which was the substrate material used, was excluded from the EDS analysis menu so that the instrument does not include it as part of the elemental calculation of the deposited film. This kind of practice is commonly performed as part of any thin film EDS analysis procedure. The stainless steel 316L source elements were analyzed using an X-ray fluorescence (XRF) analyzer in order to compare them with the deposited film. The results from the previous analysis for the set of constant powers and evaporation source are shown in FIG. 3, where the maximum and minimum ranges of each major element contained in stainless steel 316L is included. It can be seen from FIG. 3 that the constant power of 3% provided the closest elemental percentage within the maximum and minimum ranges, except for Cr, Mn, and Ni, which showed +3.33%, +1.15%, and −5.24% deviation from the stainless steel 316L elemental boundary limits, respectively. It was found that uniformity of elemental distribution of the film on the surface was achieved. The full EDS elemental percentages can be seen in Table 1, where the fixed 3% and 4% power fabricated films reflects the stainless steel of ferritic structure and depositions of higher power represents austenitic phase.

TABLE 1

EDS elemental analysis of bulk stainless steel 316L substrate and deposited films at different fixed electron beam power percentages.

| State | Characterized | Elements | | | | |
|---|---|---|---|---|---|---|
| | | Fe | Cr | Ni | Mn | Mo |
| Bulk | Stainless steel 316L | 69.22 | 16.78 | 10.12 | 2.02 | 1.32 |
| Film | Power 3 (%) | 69.52 | 21.33 | 4.76 | 4.15 | 0.25 |
| | Power 4 (%) | 62.14 | 31.35 | 2.23 | 3.96 | 0.32 |
| | Power 6 (%) | 49.77 | 38.31 | 1.21 | 10.45 | 0.26 |
| | Power 8 (%) | 37.12 | 25.39 | 1.42 | 35.73 | 0.35 |
| | Power 10 (%) | 32.74 | 25.07 | 0.66 | 41.25 | 0.28 |

EDS mapping images of the elemental distribution of the thin film layer fabricated with the low constant power (3% to 4%) demonstrated uniform elemental distribution of the film on the target surface. It is important to note that elemental mapping of Mo could not be obtained due to the EDS device element percentage detection limitations (i.e., cannot map elements of less than 0.5%). The coating method described in Example 1 above achieved stainless steel films having a different grade than the source itself (i.e. stainless steel 316L). It is believed that different categories of stainless steel films can be achieved by simply customizing the evaporation source (i.e. changing the elemental percentages of the evaporation material) and/or adjusting the EB-PVD constant power percentages.

It is to be understood that the method for synthesizing a thin film stainless steel coating is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method for synthesizing a thin film stainless steel coating, comprising:
   using electron-beam PVD coating to provide a thin film stainless steel coating on a target surface, the electron-beam PVD coating comprising conducting thermal evaporation of a source stainless steel material at a percentage of electron beam power ranging from about 3% to about 4% and a vacuum pressure of $6 \times 10^{-6}$ Torr, wherein the source stainless steel material comprises a plurality of stainless steel balls, further wherein the source stainless steel material has a first grade and the thin film stainless steel coating has a second grade that is different from the first grade, wherein the second grade includes predetermined percentages of Fe, Ni, Mn, Mo, and Cr; and
   the thin film stainless steel coating has a uniform thickness of from 1 nm to 150 nm distributed uniformly on the target surface.

2. The method as recited in claim 1, wherein the target surface includes a material selected from the group consisting of metal and ceramic.

3. The method as recited in claim 2, wherein the material is metal.

* * * * *